July 23, 1963 C. P. SPAULDING ETAL 3,099,002

ENCODER CIRCUITS

Filed Feb. 24, 1959

INVENTOR.
CARL P. SPAULDING
BY MERTON C. WILSON

Christie, Parker & Hale
ATTORNEYS.

3,099,002
ENCODER CIRCUITS

Carl P. Spaulding, San Marino, and Merton Carr Wilson, Pasadena, Calif., assignors to Datex Corporation, Monrovia, Calif., a corporation of California Filed Feb. 24, 1959, Ser. No. 794,872
11 Claims. (Cl. 340—347)

This invention relates to analog to digital converters and more particularly to encoders wherein analog information represented by the angular position of a shaft is digitized by means of sensing a binary coded disc.

This invention is related to our co-pending application entitled "Encoder Circuits" having Serial Number 794,873, filed concurrently herewith, and assigned to the same assignee as this invention. The latter mentioned application is directed to means for isolating the encoder contacts from the load circuit or digital circuit for the encoder. One of the features of this co-pending application is that the isolating circuit is arranged to continually follow and unambiguously reproduce the binary characters sensed on the encoder disc. This isolating circuit means has generally been found to be satisfactory.

In some applications, however, encoders are required to operate at such high speeds that the sensing brushes are caused to bounce or chatter and thereby give indications corresponding to the indications produced upon sensing the binary coded segments of the encoder. This brush chatter can cause error signals to be transmitted to the associated digital equipment and cause the encoder to be unreliable. Accordingly circuit means is desired for high speed encoder operation to prevent the transmission of erroneous signals due to brush vibration or chatter.

This invention provides an improved analog to digital converter or encoder capable of higher speed operation than prior art encoders without producing any erroneous output indications. This high speed encoder operation results due to the provision of an improved circuit means to be used in combination with the encoder to provide the sensed binary characters as unambiguous binary electrical signals. The circuit means comprises the combination of a time delay circuit and a switching circuit. The time delay is arranged relative to the length of the coded segments and the operating speed for the encoder whereby the signals due to brush vibration are not transmitted to the switching circuit. Therefore the signals derived from the sensing brushes must persist for a preselected interval before they are coupled to the switching circuit. These signals are necessarily only the signals resulting from sensing a conductive or nonconductive segment of the encoder.

In one of its embodiments the switching circuit may comprise transistor circuit means arranged as a pair of transistors cross coupled in an asymmetrical regenerative fashion. The input circuit of one of the transistors includes a Zener diode coupled intermediate the one transistor and the time delay circuit. The Zener diode acts in combination with the time delay circuit to control the conduction and nonconduction of the input transistor and thereby the conduction and nonconduction of the other transistor. This latter coaction results by providing a resistance-capacitor time delay circuit wherein the time the sensing signals must persist corresponds to the time required to charge the capacitor of the delay circuit to the breakdown voltage of the Zener diode.

These and other features of the present invention may be more fully appreciated when considered in the light of the following specification and drawings, in which.

Figure 1:
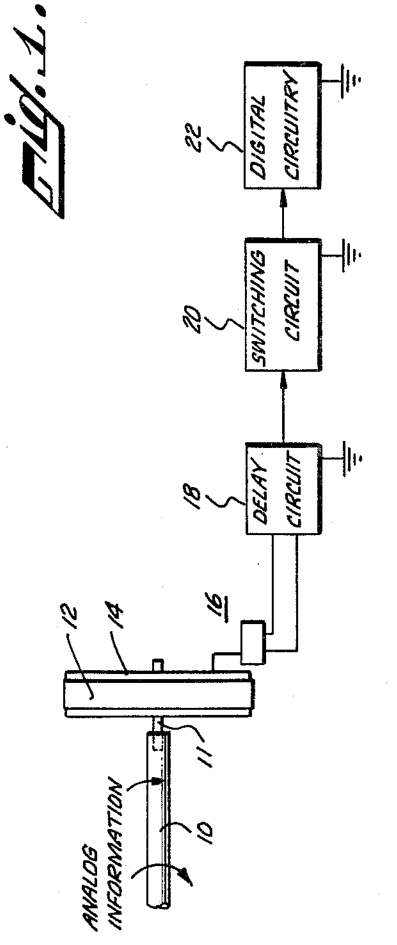
FIG. 1 is a block diagram of the encoder system embodying the invention.

Referring to FIG. 1, the encoder system will be generally examined. The analog information to be digitized is provided by a revolving shaft, shown as the shaft 10. The shaft 10 is coupled directly, in this instance, to the analog to digital converter or encoder 12 by means of an encoder shaft 11 arranged coaxially therewith. The analog to digital converter or encoder 12 will accordingly be rotatable with the shaft 10, and the various positions of the shaft will be encoded by means of a disc 14 mounted on the encoder shaft 11. The disc 14 is arranged with a plurality of spaced segments of two different kinds shown as conductive and nonconductive segments thereon arranged in a plurality of concentric tracks. The conductive and nonconductive segments may be coded to define binary characters preferably arranged in terms of a monostrophic or cyclic code. The disc 14 is provided with a sensing element or electrical brush means 16 continually engaging and aligned with the tracks on the disc 14 for providing an output indication of the sensed segments. The sensing element 16 may comprise an electrical brush means riding on the surface of the disc and providing binary coded output indications in accordance with the conductive characteristic of the sensed segment. The output indications from the sensing element 16 are coupled to a time delay circuit 18 controlling the switching times of a switching circuit 20. The switching circuit 20 in turn is coupled to deliver the binary coded electrical signals to the associated digital circuitry shown in black form and identified by the reference character 22.

It should be noted at this point that as a result of the high speed operation of the encoder 12, the output indications delivered from the brush means 16 includes signals resulting from the vibration of the brushes 16 due to the engagement and disengagement of the brushes with the disc 14. The signals resulting from this brush chatter have been found to have a time duration of the order of two to three microseconds. In contrast therewith the signals due to sensing the conductive and nonconductive segments of the disc 14 are of the order of milliseconds.

Figure 2:
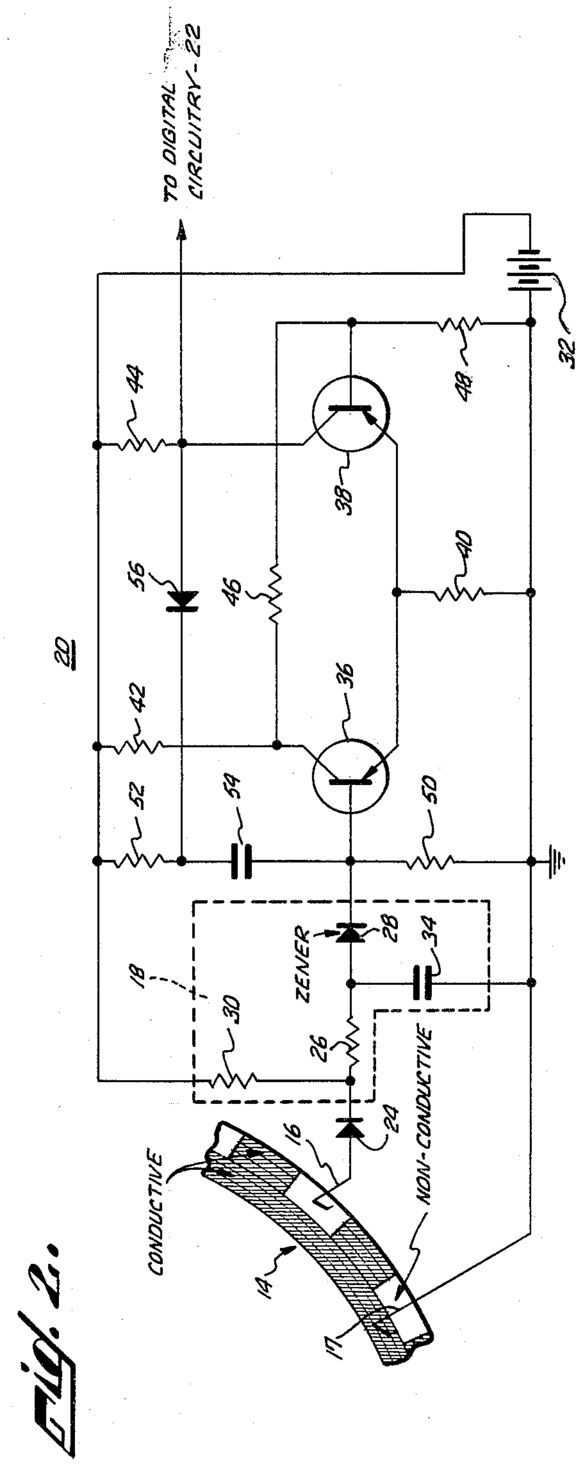
FIG. 2 is a schematic circuit diagram of the switching circuit shown in FIG. 1, with a fragmentary portion of the encoder disc.

Now, referring to FIG. 2, the circuit details of the time delay circuit 18 and the switching circuit 20 will be examined. The time delay circuit 18 is coupled to the encoder disc 14 by means of the sensing brush 16 for sensing a binary coded track for the disc, as shown, and with a common sensing brush 17 for sensing the continuous or common conductive track shown adjacent the coded track. The common brush 17 is shown connected to a point of reference potential such as the ground connection illustrated. The sensing brush 16 is shown coupled to the time delay circuit through the provision of an input diode 24. The diode 24 is connected in series circuit relationship with a resistive impedance 26 and a Zener diode 28. A resistive impedance means shown as a resistor 30 is coupled intermediate the diode 24 and the resistive impedance means 26 and which impedance means 30 has its opposite terminal connected to a point of negative potential, such as the negative terminal of the voltage source shown as a battery 32. A capacitor 34 is coupled intermediate the resistive impedance means 26 and the Zener diode 28 and which capacitor has its opposite terminal connected to ground or the positive terminal of the source 32. The combination of the resistive impedance means 26 and 30 with the capacitor 34 provides a time delay arrangement for the encoder 14. This time delay may be referred to as a fine or minimum time delay. The principal function of the resistive impedance means 26 is to limit the current through the segments of the encoder disc 14. To this end the resistive impedance means 30 may be proportioned to control solely the charging rate of the capacitor 34 when the current through the disc 14 is zero or negligible.

The switching circuit 20 comprises a pair of transistors 36 and 38 arranged as a bistable switching circuit to respond to the signals delivered from the time delay circuit 18 and correspondingly to switch their conductive conditions. To this end it should be noted that the transistors 36 and 38 are illustrated as being asymmetrically regeneratively cross coupled. The emitters for each of the transistors 36 and 38 are coupled to a common emitter resistive impedance means 40 having its opposite end connected to ground. This common emitter resistive impedance means 40 assures that whichever of the transistors 36 or 38 is in a nonconductive or cutoff state will be reverse biased and thereby prevent any emitter to base current from flowing in this nonconductive transistor. This reverse biasing results due to the current from the conducting or saturated transistor, which draws both base and collector currents, through this resistor 40, thereby causing a potential drop thereacross sufficient to provide a desired reverse biasing action.

The collector electrode for the transistor 36 is connected to a resistive impedance 42 having its remaining terminal connected to the negative side of the battery 32. The collector electrode for the transistor 38 is connected to the battery 32 in the same fashion through a collector resistive impedance 44. The collector electrode for the transistor 36 is cross coupled to the base circuit for transistor 38 through the provision of a voltage divider network which includes the resistive impedance 42 and resistive impedances 46 and 48. The resistive impedance means 46 is coupled between the collector electrode for transistor 36 and the base electrode for the transistor 38 while the resistive impedance 48 is coupled intermediate the base electrode for the transistor 38 and ground. The base electrode for the transistor 36 is provided with a resistive impedance 50 connected thereto in common with the cathode of the Zener diode 28 and to ground.

A further time delay arrangement is provided in accordance with this invention and which delay arrangement may be termed a coarse time delay. This latter arrangement comprises a series combination of a resistive impedance 52 and a capacitor 54. One terminal of the capacitor 54 is connected to the base electrode for the transistor 36 with the remaining terminal of the resistive impedance 52 connected to the negative terminal of battery 32. To assure the rapid discharge of the capacitor 54 an asymmetrical conducting element such as the diode 56 shown is connected to a point intermediate elements 52 and 54 and to the collector electrode of transistor 38. The cathode for the diode 56 is connected to a point intermediate elements 52 and 54 to provide the desired discharge path for capacitor 54. The output indications from the switching circuit 20 may be coupled to the associated digital circuitry 22 by means of a suitable connection to the collector electrode for transistor 38 to thereby derive the binary coded electrical signals therefrom corresponding to the sensed segments of disc 14.

With the above structure in mind, the operation of the combination of the time delay circuit 18 and the switching circuit 20 will be examined. Considering initially that the sensing brush 16 engages a nonconductive segment, as shown, it will be seen that the impedance between the brushes 16 and 17 will appear as an infinite impedance at the input circuit to the time delay circuit 18.

With this sensed condition prevailing the diode 24 will see the infinite impedance and the junction of the diode 24 and the resistive impedances 26 and 30 will be allowed to assume a negative voltage determined entirely by the input circuit to the transistor 36. This will then allow the capacitor 34 to charge up through the circuit provided by the resistive elements 26 and 30. Assuming that the infinite impedance between the brushes 16 and 17 were due to the sensing of an open contact and not to brush chatter, this condition will persist for a time sufficient to allow the capacitor 34 to charge up to a potential which will cause the Zener diode 28 to break down and thereby conduct in the reverse direction. With the breakdown of diode 28 current will flow from the positive terminal of the battery 32 through the resistive impedance 40, through the emitter-base circuit of transistor 36, through the Zener diode 28 and resistive impedances 26 and 30 and back to the negative terminal of the battery 32. During this interval the diode 56 is back biased and the capacitor 54 will also charge up through the resistive element 52 and the action of this delay circuit will be neglected for the present. Accordingly, with current flowing through the emitter-base circuit of the transistor 36 there will also be an emitter to collector current such that the transistor 36 will become saturated. With the transistor 36 saturated the potential on the collector electrode of this transistor approaches that of the emitter electrode, which potential is coupled by means of the resistive impedance 46 to the base circuit of the transistor 38. Since the voltage coupled thereto is reduced from the voltage at the collector of transistor 36 by virtue of the voltage-dividing network consisting of resistive elements 46 and 48, the base of transistor 38 will be positive relative to its emitter electrode and hence will be in a cutoff or nonconductive condition. At this time the potential on the collector electrode for transistor 38 approaches the voltage of the negative terminal of battery 32. It will now be appreciated that when the sensing element 16 engages a nonconductive segment that the output from the switching circuit 20 will be a high negative potential.

When the encoder disc 14 is rotated to a point where the brush 16 engages a conductive segment, the impedance existing between brushes 16 and 17 is a low impedance ranging from 0 to 200 ohms. This arrangement will then provide a current path from the battery 32 through the encoder disc 14 by means of the brushes 16 and 17 and through the resistive impedance 30 back to the source 32. When such a circuit path is provided, the capacitor 34 will no longer reach a sufficient potential to cause the Zener diode 28 to break and conduct in the reverse direction. Also, with this circuit path established the capacitor 34 will immediately discharge through resistive impedance 26 and through the encoder conductive segments in a relatively short time. This will cause the anode of the Zener diode 28 to be brought close to ground potential and will prevent the flow of current in the base circuit of transistor 36. At this time the potential of the collector electrode for transistor 36 will become negative and allow base current to be drawn through the base circuit for transistor 38. This base current will be supplied by means of the circuit path provided by resistors 42 and 46. Accordingly, transistor 38 will saturate so that the saturation current flowing through resistor 44 will cause the output voltage coupled to the digital circuitry 22 to approach ground potential. It will thus be seen that with a closed circuit condition or the sensing of a conductive segment for the encoder disc 14 a low voltage signal will be delivered to the digital circuitry 22.

Now considering the effect of the coarse time delay provided by the combination of the capacitor 54 with the resisitive impedance 52, this time delay arrangement may be considered as a coarse time delay relative to the time delay provided by the circuit 18. During the interval that base current flows in the base circuit of transistor 36, the capacitor 54 was charged up to approximately the voltage of battery 32. The charge on the capacitor 54 must be removed to allow the transistor 36 to change its conductive condition. Accordingly, to provide the discharge path to allow the transistor 36 to be cut off, the capacitor 54 is provided the current discharge path through the diode 56, through the collector and emitter circuit for transistor 38, the resistive impedances 40 and 50, and back to the opposite plate of capacitor 54. However, during this discharge time, the collector electrode of the transistor 38 abruptly draws a saturation current and as a result of the low impedance path provided by diode 56 the potential at resistive impedance 52 assumes this collector potential. Accordingly, a positive going pulse is coupled to the base electrode of the transistor 36 which is effective to drive the base circuit well beyond cutoff. This assures the abrupt cut off of the transistor 36 and the switching of conductive conditions of the two transistors. It will thus be seen that the initial time delay or fine time delay afforded by the circuit 18 is operative in conjunction with the time delay afforded by capacitor 54 and resistor 52.

As indicated hereinabove the signals due to brush bounce have a short time duration relative to the signals resulting from sensing the conductive and nonconductive segments of the encoder disc 14. Therefore, the time delay afforded by the combination of the resistors 26 and 30 and the capacitor 34 is proportioned so that these noise or momentary signals are not of a sufficient time duration to cause the capacitor 34 to charge up to the breakdown potential of the Zener diode 28. Since the signals resulting from the sensing of the coded segments of the disc 14 persist for a time much longer than these noise signals, the time delay for the delay circuit 18 is proportioned to be a fractional part of the time that the sensing element 16 is in engagement with a coded segment. This timing will necessarily be dependent upon the length of the coded segment and the speed of rotation of the coded disc 14. In a typical application the time delay is arranged to be on the order of one-third to one-half of a count or quantum time of the low order decimal digits. Therefore, if a contact closure occurs, the "output equivalent" of a closed contact will occur immediately and will persist for the "coarse" interval due to the coarse time constant. It will then persist for the remainder of the contact closure unless an open contact occurs which is longer than the "fine" interval.

While it is understood that the circuit specifications for the present invention may vary according to the desired design for any particular application, the following circuit specifications for the circuit of FIG. 2 are included by way of example:

| | | |
|---|---|---|
| Transistors 36 and 38 | | 2N465 |
| Resistors 42, 44 and 46 | ohms | 4,700 |
| Resistor 40 | do | 100 |
| Resistors 48 and 50 | do | 2,200 |
| Resistors 30 and 52 | do | 10,000 |
| Resistor 26 | do | 100 |
| Capacitor 34 | microfarads | .04 |
| Capacitor 54 | do | .05 |
| Battery 32 | volts | 10 |

It will now be seen that this invention has provided an improved encoder circuit allowing encoders to be operated at high speeds causing the sensing brushes for the encoder discs 14 to chatter, and thereby the engagement and disengagement of the brushes with the disc 14. The improved circuitry allows the high speed operation of the encoder and yet provides unambiguous binary coded output signals derived only from coded segments of the encoder disc.

What is claimed is:

1. In an encoder, a rotatable shaft mounting a disc having at least a single continuous track thereon defining binary characters as successive conductive and nonconductive segments, said rotatable shaft adapted to be responsive to analog information derived from a revolvable shaft, electrical brush means continually engaging said disc for sensing the segments thereof to provide electrical signals corresponding thereto and subject to intermittent engagement and disengagement with any one segment on said disc at a high rate and continuously providing corresponding electrical signals as a result of the rotational speed of said shaft, time delay means responsive to the electrical signals provided by said brush means and proportioned relative to the intermittent rate of disengagement to transmit only the signals corresponding to a sensed conductive or nonconductive segment, and switching circuit means having conductive and non-conductive conditions coupled to said time delay means for continuously responding to the transmitted signals and to continuously switch from a conductive to a non-conductive condition in accordance with the character of the sensed segment and the corresponding transmitted signal.

2. In an encoder as defined in claim 1 wherein said time delay means comprises a resistor and capacitor connected in series circuit relationship and with said brush means coupled to a point intermediate said resistor and capacitor, a Zener diode coupled to said intermediate point and to said switching means, the time of reaching the breakdown voltage of said Zener diode being a function of the charging time of said capacitor, said time delay means being proportioned whereby only signals provided by said brush means as a result of sensing said segments are capable of charging and discharging said capacitor to the breakdown voltage of said Zener diode.

3. In a high speed encoder, a rotatable shaft mounting a disc having at least a single track thereon comprising sequentially arranged conductive and nonconductive segments representative of binary coded characters, said rotatable shaft adapted to be responsive to analog information derived from a revolving shaft, sensing means for continually engaging said disc to serially sense said segments and to continuously provide electrical signals representative of the sensed binary characters and subject to intermittent engagement and disengagement with any one segment on said disc, switching means for continuously reproducing the electrical signals derived from said sensing means as unambiguous binary electrical signals, and time delay circuit means coupled intermediate said sensing means and said switching means said time delay means is proportioned to transmit only electrical signals from said sensing means having a preselected time duration relative to the length of said coded segments and the speed of the encoder.

4. In an encoder, a rotatable shaft mounting a disc having at least a single continuous track thereon comprising conductive and nonconductive segments representative of binary coded characters, said rotatable shaft adapted to be responsive to analog information derived from a revolving shaft, sensing means for continually engaging said disc to serially sense said segments and to continuously provide electrical signals representative of the sensed binary characters and subject to intermittent engagement and disengagement with any one segment on said disc, switching means coupled to be continuously responsive to the electrical signals provided by said sensing means for reproducing the sensed track of segments as binary coded electrical characters, said switching means being arranged to be in one conductive condition during the sensing of one kind of said segments and switchable to another conductive condition during the sensing of the other kind of said segments and then switchable back to said one conductive condition upon sensing the succeeding segment of said one kind, and time delay means intermediate said switching means and said sensing means, said time delay means is proportioned relative to the time duration of the binary coded characters to thereby control the signals coupled to said switching means.

5. A switching circuit for use with a coded disc having binary coded characters thereon, comprising a pair of transistors each having an emitter, collector and base electrode, means for biasing the emitter-base circuits for each of said transistors, impedance means coupled to each of said base electrodes and a point of reference potential, impedance means coupled between the collector electrode of one of said transistors and to the base electrode of the other transistor, individual impedance means coupled to each collector electrode and a point of opposite potential relative to said reference potential, time delay means, a Zener diode coupled intermediate said time delay means and the base electrode of said one transistor, said delay means comprising a resistance-capacitance network having a time delay dependent on the time duration of said binary characters and the breakdown voltage of said Zener diode, impedance means coupled to the opposite side of said time delay means from said diode and to said opposite potential point, and means for delivering binary coded electrical signals to said Zener diode.

6. A switching circuit as defined in claim 5 wherein said time delay means comprises a resistive impedance means connected in series with said Zener diode and said latter mentioned impedance means and a capacitor coupled to said diode in common with said resistive impedance means and the reference potential.

7. A switching circuit as defined in claim 6 wherein each of said impedance means comprise resistive impedance means, said means for biasing said emitter-base circuits comprises a common resistive impedance coupled to said emitter electrodes and the reference potential, and includes a series combination of a resistor and capacitor connected between the point of opposite potential and said base and an asymmetrical conductive element coupled intermediate said latter mentioned resistor and capacitor and said collector electrode of the other transistor.

8. In an encoder, a rotatable shaft mounting a disc having at least a single continuous track thereon having binary characters recorded as conductive and nonconductive segments, sensing means mounted for continuously engaging said disc for sensing the segments thereof to continuously provide binary coded electrical signals corresponding thereto, said rotatable shaft being adapted to be responsive to analog information to drive the shaft at a rate to cause the sensing means to intermittently engage and disengage from the disc and thereby provide electrical signals corresponding to the recorded binary characters whereby erroneous signals may be derived from the encoder, switching circuit means having two conductive conditions and continuously switchable therebetween coupled to said sensing means to be switchably responsive to each change in the binary character of the signal coupled thereto, first time delay means having a time delay greater than the time intervals during which the sensing means is disengaged from the disc and coupled intermediate said sensing means and said switching circuit to thereby transmit thereto only the electrical signals corresponding to a sensed conductive or nonconductive segment, and a second time delay circuit connected to be responsive to the signals derived from said first delay circuit to maintain said switching circuit in its switched conductive condition for a preselected interval thereafter.

9. In an encoder as defined in claim 8 wherein the second time delay circuit has a delay time greater than the delay time for said first time delay means proportioned relative to the speed of the shaft and the length of the segments of said disc whereby the switching circuit is rendered insensitive to any further signals coupled thereto during said second delay interval.

10. In an encoder, a rotatable shaft mounting a disc having at least a single continuous track thereon having binary characters recorded as conductive and nonconductive segments, sensing means mounted for continuously engaging said disc for sensing the segments thereof to continuously provide binary coded electrical signals corresponding thereto, said rotatable shaft being adapted to be responsive to analog information to drive the shaft at a rate to cause the sensing means to intermittently engage and disengage any one segment on the disc and thereby provide electrical signals corresponding to the recorded binary characters whereby erroneous signals may be derived from the encoder, switching circuit means having two conductive conditions and continuously switchable therebetween coupled to said sensing means to be switchably responsive to each change in binary signal coupled thereto, said switching circuit comprises a pair of transistors and circuit means for asymmetrically regeneratively cross-coupling the transistors to alternately place them in conductive and nonconductive conditions in accordance with the binary character of the signals applied to the circuit means, first time delay means having a time delay greater than the time intervals during which the sensing means is disengaged from the disc and coupled intermediate said sensing means and one of said transistors to thereby transmit only the electrical signals corresponding to a sensed conductive or nonconductive segment, said switching circuit further comprising a second time delay circuit coupled to the control electrode of said one transistor and responsive to the signals derived from said first delay circuit to maintain the transistors in their respective conductive conditions for a preselected interval after they have changed state, and an asymmetrical conductive device connected to said second time delay circuit and to the output electrode of the other transistor and poled to cause said second delay circuit to be effective in accordance with the conductive condition of said one transistor.

11. In an encoder, a rotatable shaft mounting a disc having at least a single continuous track thereon having a binary characters recorded as conductive and nonconductive segments, sensing means mounted for continuously engaging said disc for sensing the segments thereof to continuously provide binary coded electrical signals corresponding thereto, said rotatable shaft being adapted to be responsive to analog information to drive the shaft at a rate to cause the sensing means to intermittently engage and disengage any one segment on the disc and thereby provide electrical signals corresponding to the recorded binary characters whereby erroneous signals may be derived from the encoder, switching circuit means having two conductive conditions and continuously switchable therebetween coupled to said sensing means to be switchably responsive to each change in the binary character of the signal coupled thereto, said switching circuit comprising a pair of transistors each having an input, output, and control electrode, impedance means including a common impedance element for biasing the input-control electrode circuit of each of said transistors relative to a reference potential to assure one of said transistors is in a nonconductive condition while the other is in a conductive condition, impedance means coupled between the output electrode of one of said transistors and the control electrode of the other of said transistors, individual impedance means coupled to each output electrode and a point of opposite potential with respect to said reference potential, a resistance-capacitance time delay circuit coupled to the control electrode for said one transistor, an asymmetrical conductive device connected to the junction of said resistance-capacitance circuit and to the output electrode of the other transistor and poled to cause the charging and discharging of the capacitor in accordance with the conductive and nonconductive condition respectively of said one transistor, another time delay means having a time delay greater than the time intervals during which the sensing means is disengaged from the disc and coupled intermediate said sensing means and the input-control circuit of said one transistor to thereby transmit thereto only the electrical signals corresponding to a sensed conductive or nonconductive segment, the resistance-capacitance time delay circuit coupled to said one transistor is responsive to the signals derived from said another delay circuit to maintain the transistors in their respective conductive conditions for a preselected interval after they have assumed their respective conductive conditions.

References Cited in the file of this patent

UNITED STATES PATENTS

| | | |
|---|---|---|
| 2,793,807 | Yaeger | May 28, 1957 |
| 2,866,106 | Schuh | Dec. 23, 1958 |
| 2,873,441 | Miller | Feb. 10, 1959 |
| 2,899,673 | Reiner | Aug. 11, 1959 |
| 2,906,892 | Jones | Sept. 29, 1959 |